(12) United States Patent
Einaga et al.

(10) Patent No.: US 6,574,149 B2
(45) Date of Patent: Jun. 3, 2003

(54) SEMICONDUCTOR MEMORY AND ITS USAGE

(75) Inventors: Yuichi Einaga, Kawasaki (JP); Kiyoshi Itano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/097,924

(22) Filed: Mar. 15, 2002

(65) Prior Publication Data

US 2002/0093851 A1 Jul. 18, 2002

Related U.S. Application Data

(63) Continuation of application No. PCT/JP00/03467, filed on May 30, 2000, now abandoned.

(30) Foreign Application Priority Data

Oct. 15, 1999 (JP) ............................................. 11-294199

(51) Int. Cl.[7] ................................................. G11C 16/04
(52) U.S. Cl. .............................. 365/185.29; 365/185.18
(58) Field of Search ....................... 365/185.29, 185.18, 365/185.28

(56) References Cited

U.S. PATENT DOCUMENTS

| | | | |
|---|---|---|---|
| 5,414,665 A | 5/1995 | Kodama | |
| 5,657,271 A | 8/1997 | Mori | |
| 5,825,686 A | 10/1998 | Schmitt-Landsiedel et al. | |
| 5,838,041 A | * 11/1998 | Sakagami et al. | .......... 257/324 |
| 6,011,725 A | * 1/2000 | Eitan | ...................... 365/185.29 |

FOREIGN PATENT DOCUMENTS

| | | |
|---|---|---|
| JP | 59-11682 | 1/1984 |
| JP | 5-110112 | 4/1993 |
| JP | 06125064 | 6/1994 |
| JP | 6-291327 | 10/1994 |
| JP | 7-245352 | 9/1995 |
| JP | 9-27560 | 1/1997 |
| JP | 11-500559 | 1/1999 |
| JP | 11-204666 | 7/1999 |
| JP | 2000-30471 | 1/2000 |
| WO | WO 99/07000 | 2/1999 |

* cited by examiner

Primary Examiner—Huan Hoang
(74) Attorney, Agent, or Firm—Armstrong, Westerman & Hattori, LLP.

(57) ABSTRACT

A semiconductor memory comprises a p-type silicon substrate including a first diffused layer and a second diffused layer, and a gate insulation film in which carriers are trapped in different areas. A first voltage and a second voltage are applied to the p-type silicon substrate and the gate electrode, respectively, to allow tunnel current to flow between the p-type silicon substrate and the gate electrode so that the tunnel current may eliminate the carriers trapped in the gate insulation film. This allows all the electrons captured in the central portion of the channel area to disappear, resulting in more reliable data erasure.

9 Claims, 5 Drawing Sheets

SEMICONDUCTOR MEMORY AND ITS USAGE

CROSS-REFERENCE TO RELATED APPLICATIONS

This is a continuation of Application PCT/JP00/03467, filed May 30, 2000, now abandoned.

TECHNICAL FIELD

The present invention relates to a semiconductor memory and its usage and it is more useful in recording 2-bit information in one memory cell in a nonvolatile semiconductor memory.

BACKGROUND ART

In recent years, the nonvolatile semiconductor memory capable of recording 2-bit information in one memory cell by arranging the carrier injection position have been studied and developed. This nonvolatile semiconductor memory is so characterized that carriers are trapped in a gate insulation film formed below the gate. The direction of a voltage applied between a source and a drain is reversed depending upon a write or read mode of information. Electrons are therefore independently captured, in the gate insulation film, at positions corresponding to the two ends of a channel area. Accordingly, the 2-bit information can be recorded depending on whether electrons are captured or not at the two ends.

For example, International Patent Laid-Open No. WO 99/07000 discloses a nonvolatile semiconductor memory having this structure. The structure of a nonvolatile semiconductor memory and the data write/erase processing in the nonvolatile semiconductor memory taught in this document will be briefly described with reference to FIGS. 5A and 5D.

As shown in FIGS. 5A to 5D, a nonvolatile semiconductor memory 100 comprises first and second diffused layers 102 and 103 functioning as a source/drain formed in the surface area of a p-type silicon substrate 101, a gate insulation film 104 including a carrier trap area 104a formed on the p-type silicon substrate 101 almost between the first and second diffused layers 102 and 103, and a gate electrode 105 formed on the gate insulation film 104. The carrier trap area 104a includes a silicon nitride film or the like, and exhibits a higher carrier trap characteristic than that of the other areas within the gate insulation film 104.

In this nonvolatile semiconductor memory 100, electrons are captured independently at areas 106 and 107 which correspond to two ends of the channel area in the gate insulation film 104, so that a 2-bit information can be finally recorded.

Figure 5A:
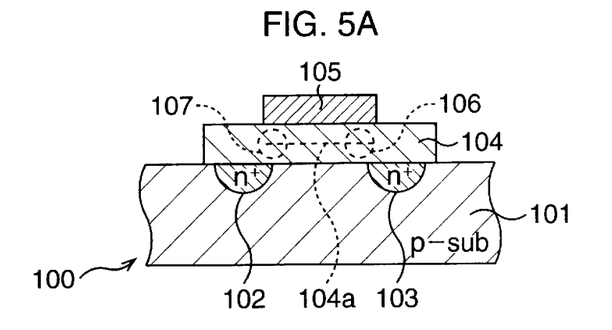
FIGS. 5A to 5D are schematic sectional views showing the structure of a memory cell in a conventional semiconductor memory.

FIG. 5A shows a state wherein the electrons are not captured yet in the gate insulation film 104. This state of the memory cell (threshold voltage: $V_{th}$) defines a "Erase State". When 0 (zero) V to the first diffused layer 102, nearly 5 V to the diffused second layer, and 10 V to the gate electrode 105 in this memory cell are applied respectively, hot electrons are generated near the second diffused layer 103, the electrons are captured in the area 106 in the gate insulation film 104 near the second diffused layer 103, and the memory cell shift to a programmed state.

To capture electrons in the other area 107, the programming voltages applied to the first and second diffused layers 102 and 103 are switched; or 5 V to the first diffused layer 102, 0 (zero) V to the second diffused layer 103, and 10 V to the gate electrode 105 are applied respectively. Then, the electrons are captured in both areas 106 and 107, as shown in FIG. 5B.

Figure 5B:
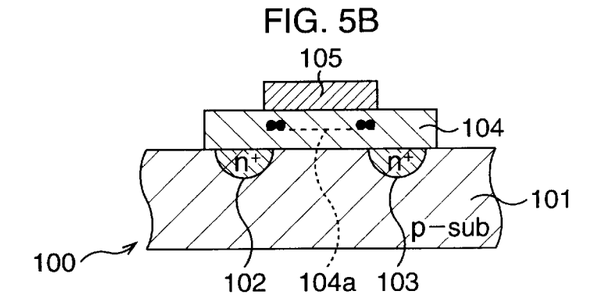

To electrically return the state (programmed state) wherein electrons are locally captured in the areas 106 and 107, as shown in FIG. 5B, to the erase state shown in FIG. 5A, +5 V to the first and second diffused layers 102 and 103 and −5 V to the gate electrode 105 are applied, respectively. In this case, electrons captured in the gate insulation film 104 near the first and second diffused layers 102 and 103 are neutralized by hot holes locally generated near the first and second diffused layers 102 and 103. Thus, the stored data in the programmed state can be erased.

Figure 5C:
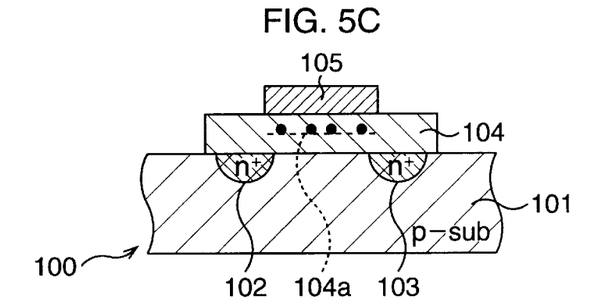

However, if the electrons captured in the gate insulation film 104 diffusely exist in the lateral direction (along the first and second diffused layers 102 and 103 in FIG. 5C) due to repulsion against each other, disturbance in the read mode, as shown in FIG. 5C, it is difficult to completely erase the electrons in all the area. Especially when the write and read modes are repeated, the electrons remain at the center of the channel area in the gate insulation film 104 and they are gradually accumulated.

In the erase processing under the above-described voltage conditions, only electrons captured near the first and second diffused layers 102 and 103 may be neutralized, because the captured electrons are neutralized by injecting into the gate insulation film 104 hot holes generated near the first and second diffused layers 102 and 103. Therefore, in the erase processing under the above-described voltage conditions, the electrons remained near the center of the channel cannot be neutralized nor erased.

Figure 5D:
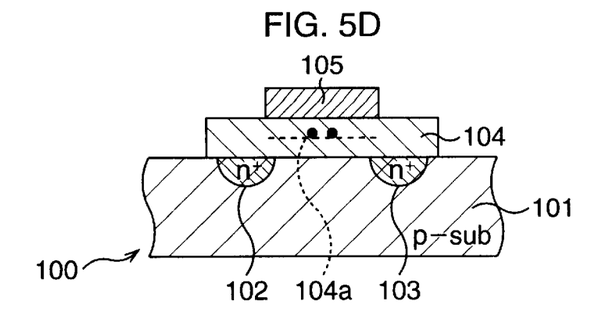

The electrons, which cannot be erased and remained near the center of the channel in the gate insulation film 104, causes an increase of the threshold voltage ($V_{th}$) for the memory cell, so the memory cell state shown in FIG. 5B cannot be discriminated against that shown in FIG. 5D. In the memory cell state shown in FIG. 5D, the capture state of the electrons in the area 106 or 107 can not be confirmed to thereby lower the writing reliability.

The present invention has been made to overcome the conventional drawbacks, and has as its object to provide a semiconductor memory capable of reliably erasing captured electrons even when the electrons captured in a gate insulation film of a memory cell diffuse laterally, and its usage based on a characteristic erase algorithm for erasing captured electrons to thereby increase the data write/erase reliability.

SUMMARY OF THE INVENTION

According to the present invention, there is provided a semiconductor memory which has a pair of impurity-diffused layers formed in a surface area of a semiconductor substrate, and a gate electrode formed on a gate insulation film on the semiconductor substrate between the pair of impurity-diffused layers, to thereby traps carriers at different positions in the gate insulation film by applying a predetermined voltage to the gate electrode, and wherein a tunnel current is supplied between the semiconductor substrate and the gate electrode by applying a first voltage to the semiconductor substrate including the pair of impurity-diffused layers and applying a second voltage to the gate electrode, and the tunnel current erases the carriers trapped in the gate insulation film.

According to the present invention, there is provided a usage of a semiconductor memory which has a pair of impurity-diffused layers formed in a surface area of a semiconductor substrate, and a gate electrode formed on a gate insulation film on the semiconductor substrate between the pair of impurity-diffused layers, to thereby trap carriers at different positions in the gate insulation film by applying a predetermined voltage to the gate electrode, comprising the steps of: supplying a tunnel current between the semiconductor substrate and the gate electrode by applying a first voltage to the semiconductor substrate including the pair of impurity-diffused layers and applying a second voltage to the gate electrode, and erasing the carriers trapped in the gate insulation film by the tunnel current.

The present invention is realized by the above technique. By supplying a tunnel current between the semiconductor substrate and the gate electrode, electrons in the entire area of the gate insulation film can be reliably erased regardless of the position where electrons are captured in the gate insulation film. Hence, electrons remaining near the center of the channel area, which are particularly difficult to erase, can be reliably erased.

The present invention can surely erase electrons without leaving them near the center of the channel area in a semiconductor memory in which electrons are captured in an insulation film having a carrier trap area. The present invention can therefore provide a semiconductor memory which increases the reliability by reliably erasing electrons.

DETAILED DESCRIPTION OF THE PREFERRED EMBODIMENTS (First Embodiment)

Figure 1A:
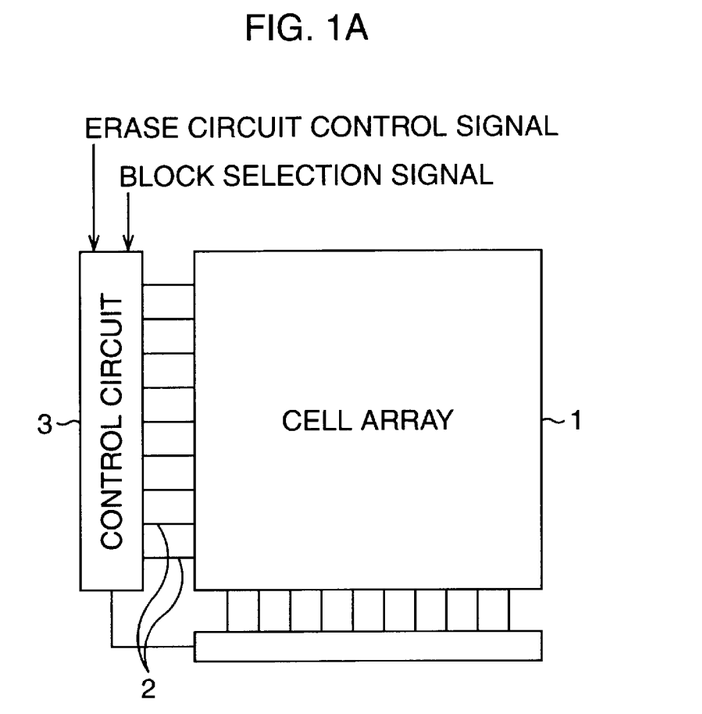
FIGS. 1A and 1B are schematic views showing the planar arrangement of a semiconductor memory according to first and second embodiments of the present invention.
Figure 1B:
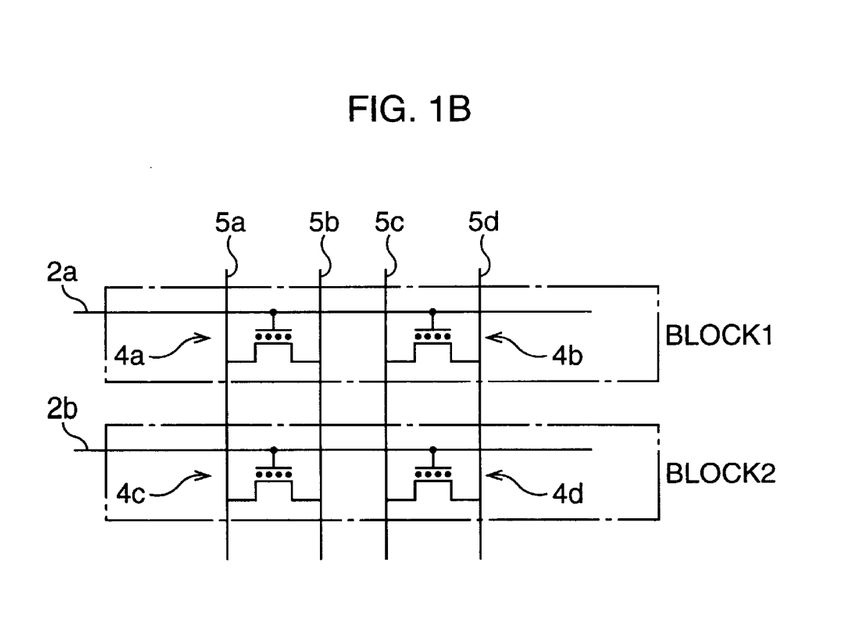
Figure 2A:
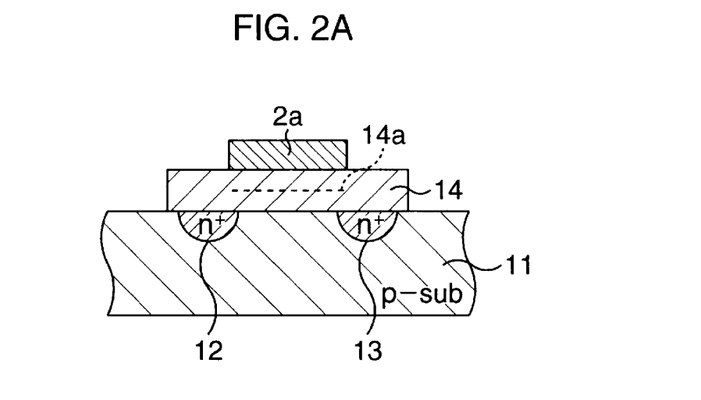
FIGS. 2A to 2C are schematic sectional views showing the structure of each memory cell in the semiconductor memory according to the first embodiment of the present invention.
Figure 2B:
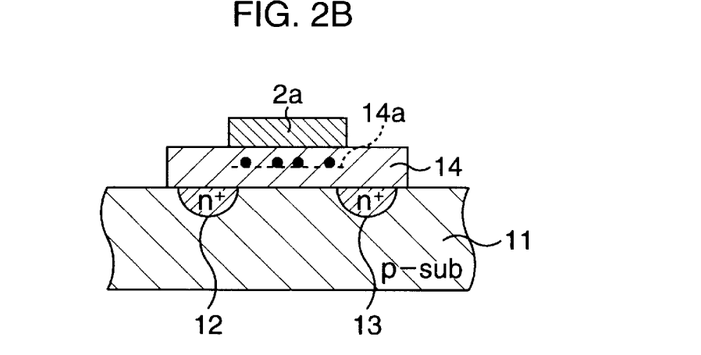
Figure 2C:
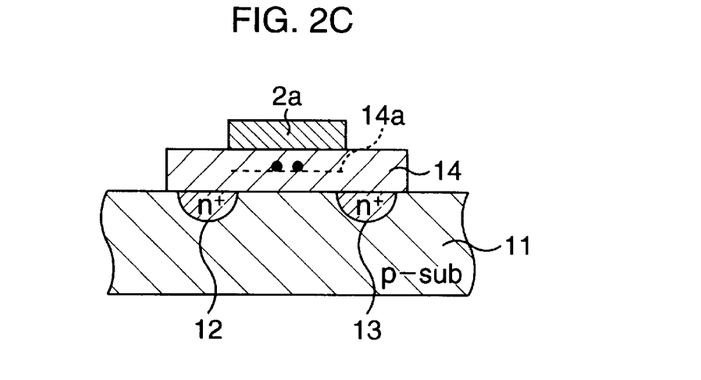

A first embodiment of the present invention will be described with reference to the accompanying drawings. FIGS. 1A and 1B are schematic views showing the planar arrangement of a semiconductor memory according to the first embodiment. FIGS. 2A to 2C are schematic sectional views showing the structure of each memory cell in the semiconductor memory according to the first embodiment.

As shown in FIG. 1A, the semiconductor memory of the first embodiment has a cell array 1, control gates 2 each connected to the memory cells aligned in the cell array 1, and a control circuit 3 including an erase circuit connected to the control gates 2.

FIG. 1B is a schematic view of four memory cells 4a to 4d in the cell array 1 for an explanatory purpose of the circuit arrangement. The memory cells 4a to 4d each are connected to control gates 2a and 2b, wherein the memory cells 4a and 4b are connected to the control gate 2a, whereas the memory cells 4c and 4d are connected to the control gate 2b.

The memory cells 4a to 4d are connected to source/drain (S/D) lines 5a to 5d which run in the column direction. The memory cells 4a and 4c are connected to the source/drain (S/D) lines 5a and 5b, while the memory cells 4b and 4d are connected to the source/drain (S/D) lines 5c and 5d.

The primary structure of each of the memory cells 4a to 4d in the first embodiment is the same as that of the memory cells in the conventional semiconductor memory described with reference to FIGS. 5A to 5D. FIGS. 2A to 2C typically show the structure of the memory cell 4a out of the memory cells 4a to 4d. The remaining memory cells are also the same in arrangement as the memory cell 4a. The memory cell 4a comprises first and second diffused layers 12 and 13 formed in the surface area of a p-type silicon substrate 11, a gate insulation film 14 including a carrier trap area 14a formed on the p-type silicon substrate 11, and the control gate 2a formed on the gate insulation film 14.

As shown in FIG. 1A, the control gate 2a is connected to the control circuit 3. The first and second diffused layers 12 and 13 are respectively connected to the source/drain lines 5a and 5b shown FIG. 1B.

FIG. 2A shows a state (erase state) wherein no electron is captured in the gate insulation film 14 including a carrier trap area 14a. This state is the same as the state shown in FIG. 5A.

FIG. 2B shows the same state as that in FIG. 5C. More specifically, FIG. 2B shows a state wherein electrons, which are captured in the gate insulation film 14 and localized near the first and second diffused layers 12 and 13, diffuse laterally owing to their repulsion, disturbance in the read mode, or the like.

The semiconductor memory of this embodiment has two erase circuits in order to erase captured electrons shown in FIG. 2B and then return to the state shown in FIG. 2A.

The first erase circuit employs the same process as that described with reference to FIGS. 5A to 5D. The nearly +5 V (third voltage) is applied to the first and second diffused layers 12 and 13 via the source/drain lines 5a and 5b, and the nearly −5 V (fourth voltage) is applied from the control circuit 3 to the control gate 2a. Electrons captured in the gate insulation film 14 near the first and second diffused layers 12 and 13 are neutralized by hot holes generated near the first and second diffused layers 12 and 13. Accordingly, data written in the memory cell 4a can be erased.

As the second erase circuit, the source/drain lines 5a to 5d and the p-type silicon substrate 11 are set at 0 (zero) V (first voltage). The control circuit 3 shown in FIG. 1A supplies an erase circuit control signal and block selection signal, thereby setting the potential of the control gate 2a in a block subjected to erase to about −15 V (second voltage). The control gate 2a becomes lower in potential than the p-type silicon substrate 11 and the first and second diffused layers 12 and 13. In addition, the control gate 2a is set to a negative potential of about −15 V. Thus, a tunnel current flows between the control gate 2a and the p-type silicon substrate 11. This tunnel current almost completely removes electrons in the gate insulation film 14.

In erase by the second erase circuit, all the source/drain lines 5a to 5d are set at 0 (zero) V, and the p-type silicon substrate 11 is also set at 0 (zero) V. Data in all the memory cells connected to the control gate 2a which receives −15 V are erased. In the example of FIG. 1B, electrons in all the memory cells in block 2 are erased.

An erase algorithm of erasing captured electrons from the state shown in FIG. 2B and returning to the state shown in FIG. 2A will be explained with reference to the flow chart of FIG. 3.

In step S10, whether data has completely been erased is verified. More specifically, verification is done on the basis of whether the thresholds of all the memory cells included in a target block are lower than the threshold of an erase verification comparison cell (reference cell). If the thresholds of all the memory cells are lower than the threshold of the erase verification comparison cell, the flow advances to step S11 to end erase operation. If even one of the memory cells included in the target erase block has a threshold higher than that of the erase verification comparison cell, erase verification fails, a counter A is counted up, and the flow shifts to step S12. The counter A counts the number of failures in erase verification.

In step S12, the count of the counter A is confirmed. If the count of the counter A is smaller than M, the flow shifts to step S13. The count M is a predetermined count.

In step S13, the first erase circuit performs erase. To erase data in the memory cell 4a shown in FIG. 1B, a voltage of 5 V is applied to the source/drain line 5a, and 0 (zero) V is applied to the source/drain lines 5b to 5d. The control circuit 3 shown in FIG. 1A changes the voltage of the control gate 2a to −5 V.

Then, the control gate 2a becomes lower in potential than the first diffused layer 12 connected to the source/drain line 5a. Hot holes are injected from the first diffused layer 12 to the insulation film 14, and electrons captured in the carrier trap area 14a in the gate insulation film 14 are erased. Then, the flow advances to step S14.

In erase by the first erase circuit, a voltage of 5 V may be applied to both the source/drain lines 5a and 5b. In this case, hot holes are injected from both the first and second diffused layers 12 and 13 to the gate insulation film 14, and electrons captured at the two ends of the carrier trap area 14a in the gate insulation film 14 are erased.

FIG. 2C shows a state wherein the first erase circuit erases electrons captured in the memory cell in the state shown in FIG. 2B. In erase by the first erase circuit, electrons near the first diffused layer 12 can be erased by injecting hot holes from the first diffused layer 12, but electrons at the center of the carrier trap area 4a, i.e., electrons at the middle position between the first and second diffused layers 12 and 13 cannot be erased. Even if 0 (zero) V, 5 V, and −5 V are respectively applied to the first diffused layer 12, second diffused layer 13, and control gate 2, only electrons near the second diffused layer 13 are erased, but electrons at the middle position between the first and second diffused layers 12 and 13 remain unerased. Hence, such electrons which are difficult to erase by the first erase circuit must be reliably erased.

In step S14, the erase count is confirmed by a counter B. If the count is smaller than N, the flow returns to step S10 to check whether data has completely been erased. The counter B counts the number of operations of executing the first erase circuit. The count N is a predetermined count, and satisfies M>N where M is the predetermined count used in the counter A. More specifically, if the first erase circuit is executed N times but data has not completely been erased, it is assumed that data is difficult to completely erase by only erase of the first erase circuit. Thus, the flow advances to step S15 to erase by the second erase circuit.

In erase by the second erase circuit, the source/drain lines 5a and 5b and the p-type silicon substrate 11 are set at 0 (zero) V. An erase circuit control signal and block selection signal are supplied to the control circuit 3. Then, the control circuit 3 sets the potential of the control gate 2a to about −15 V, which is lower than the potential used in the first erase circuit.

The control gate 2a becomes lower in potential than the p-type silicon substrate 11 and the first and second diffused layers 12 and 13, and is set as low as −15 V. Thus, a tunnel current flows between the control gate 2a and the p-type silicon substrate 11. This enables almost completely removing electrons in the gate insulation film 14. Even when electrons are not completely erased by the first erase circuit and remain unerased near the center of the channel, as shown in FIG. 2C, the residual electrons can be reliably erased by flowing a tunnel current between the control gate 2a and the p-type silicon substrate 11 by using the second erase circuit.

After erase by the second erase circuit, the flow returns to step S10 to check again whether data have completely been erased in all the memory cells. If data have completely been erased, the flow shifts to step S11 to end erase operation.

If it is determined in step S10 that data have not completely been erased, the flow shifts to step S12 to repeat the above-described procedures. If the count of the counter A is M or more in step S12, the flow is hanged in step S16 in order to prevent the flow from forming an infinite loop. Then, the flow advances to step S17 to forcibly end erase operation.

As described above, according to the first embodiment of the present invention, a voltage lower than that of the p-type silicon substrate 11 is applied to the control gate 2a to generate a large potential difference between the control gate 2a and the p-type silicon substrate 11 and supply a tunnel current between them. This tunnel current can reliably erase electrons remaining at the middle position between the first and second diffused layers 12 and 13, which are difficult to erase by the first erase circuit. Even if carriers captured in the gate insulation film 14 diffuse in the gate insulation film 14, electrons are prevented from remaining at the middle position between the first and second diffused layers 12 and 13 and can be reliably erased. The second erase circuit is used only when electrons are first erased by the first erase circuit but are not completely erased. This can minimize application of a high voltage to the control gate 2a and p-type silicon substrate 11.

(Second Embodiment)

Figure 4A:
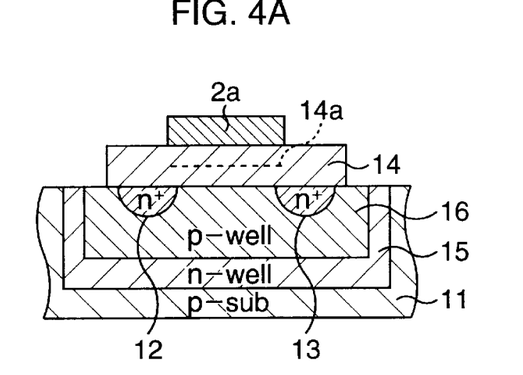
FIGS. 4A to 4C are schematic sectional views showing the structure of each memory cell in the semiconductor memory according to the second embodiment of the present invention.
Figure 4B:
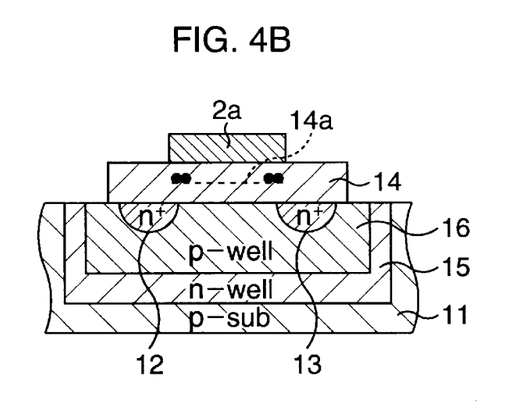
Figure 4C:
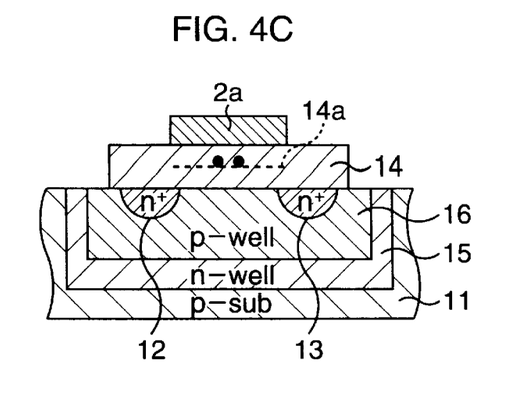

The second embodiment of the present invention will be described with reference to the accompanying drawings. FIGS. 4A to 4C show the structure of each memory cell in a semiconductor memory according to the second embodiment. The structure of the semiconductor memory according to the second embodiment will be explained with reference to FIGS. 4A to 4C. The planar arrangement of the semiconductor memory according to the second embodiment is the same as that according to the first embodiment shown in FIG. 1. FIGS. 4A to 4C show the structure of the memory cell 4a shown in FIG. 1B. In FIGS. 4A to 4C, the same reference numerals as in the first embodiment shown in FIGS. 2A to 2C denote the same parts.

The active area of a memory cell in the semiconductor memory of the second embodiment is designed in a p-well 16 in an n-well 15 formed in a p-type silicon substrate 11. The memory cell in the second embodiment is formed by first and second diffused layers 12 and 13 formed apart from each other by a predetermined distance in the p-well 16, a gate insulation film 14 having a carrier trap area 14a formed on the first and second diffused layers 12 and 13, and a control gate 2a formed on the gate insulation film 14. The first and second diffused layers 12 and 13 of the memory cell 4a are respectively connected to source/drain lines 5a and 5b shown in FIG. 1B. The memory cell state shown in FIG. 4A is an initial state (erase state) wherein no charge is captured.

The semiconductor memory in the second embodiment also comprises two, first and second erase circuits, similar to the first embodiment. The first erase circuit is the same as that of the first embodiment. The second erase circuit uses an application voltage different from that of the first embodiment.

FIG. 4B shows a state wherein electrons are captured in the gate insulation film 14 near the first and second diffused layers 12 and 13 in the memory cell of the second embodiment. In this case, electrons can be erased by the first erase circuit described in the first embodiment.

FIG. 4C shows a state wherein electrons captured in the gate insulation film 14 near the first and second diffused layers 12 and 13 exist in the gate insulation film 14 near the center of the channel. In this case, electrons are erased by the following second erase circuit.

For example, the control gate 2a of a block subjected to erase is set at 0 (zero) V (second voltage) by supplying an erase circuit control signal and block selection signal to a control circuit 3. A voltage of 20 V (first voltage) is applied to the p-well 16 and n-well 15 to generate a large potential difference between the control gate 2a and the p-well 16 and supply a tunnel current between them. As a result, electrons captured in the gate insulation film 14 near the center of the channel can be neutralized, similar to the second erase circuit described in the first embodiment. The state in FIG. 4C can be returned to the state in FIG. 4A.

Since the second embodiment applies a relatively large positive voltage to the p-well 16 in erase by the second erase circuit, the n-well 15 is formed between the p-type silicon substrate 11 and the p-well 16. The n-well 15 can surely separate the p-type silicon substrate 11 from the p-well 16.

As another example of the second erase circuit according to the second embodiment, voltages of −10 V (second voltage) and 10 V (first voltage) may be respectively applied to the p-well 16 and n-well 15.

Figure 3:
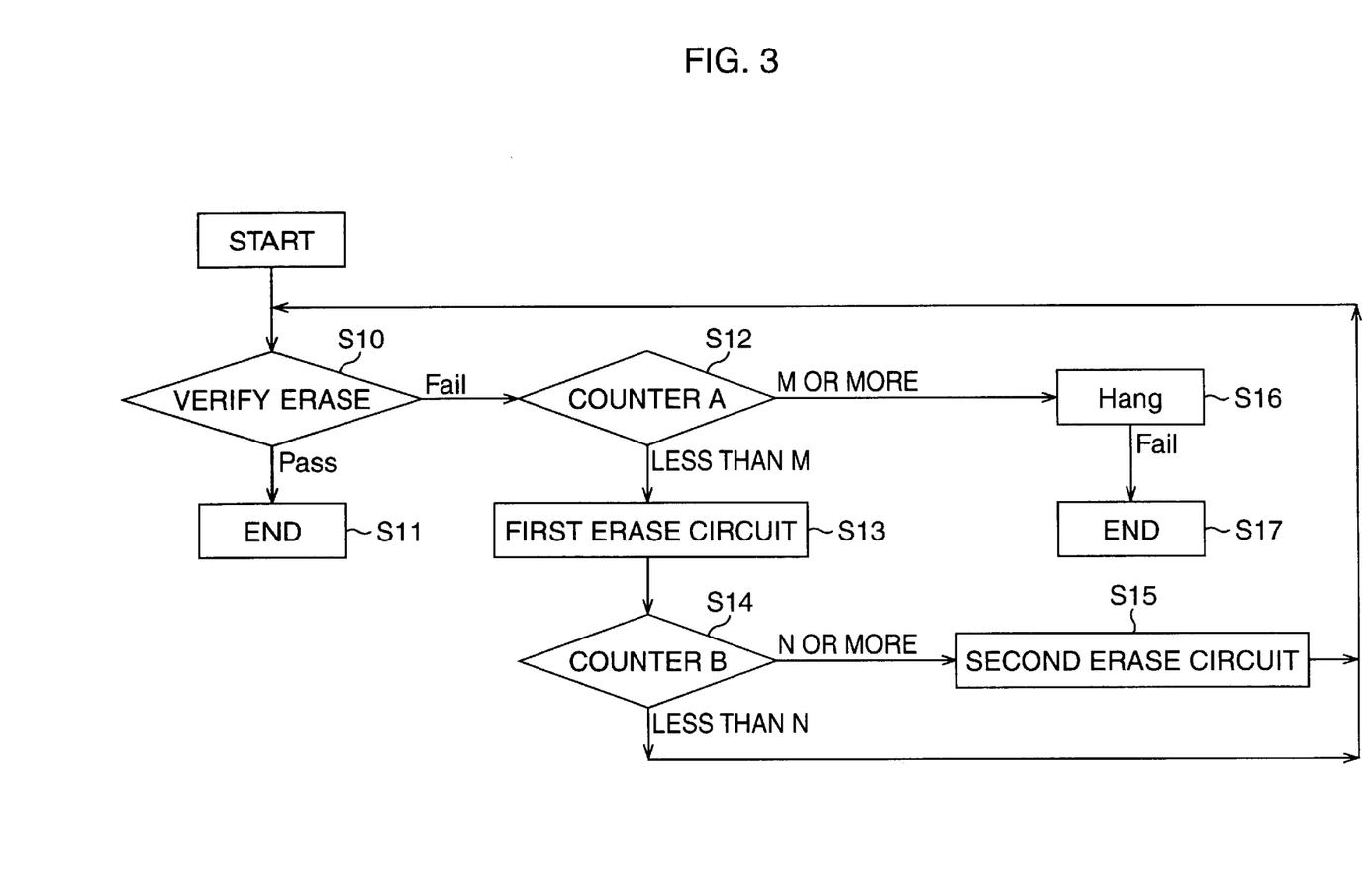
FIG. 3 is a flow chart showing the procedures of erasing electrons accumulated in the memory cell of the semiconductor memory according to each embodiment of the present invention.

Erase operation can be executed using the second erase circuit in the second embodiment by the same algorithm as that of the first embodiment shown in FIG. 3.

As described above, according to the second embodiment of the present invention, the n-well 15 surrounds the p-well 16 of the p-type silicon substrate 11 which receives a high voltage. The n-well 15 can reliably separate the p-type silicon substrate 11 from the p-well 16, and can increase the breakdown voltage of the p-well 16 and p-type silicon substrate 11. The control gate 2a and p-well 16 can be given a larger potential difference in comparison with the first embodiment, and electrons captured in the gate insulation film 14 can be reliably erased. When both the p-well 16 and n-well 15 are set at 10 V and the control gate 2a is set at −10 V, a circuit for supplying a voltage to the p-well 16 and n-well 15 and a circuit for supplying a voltage to the control gate 2a can be simultaneously operated independently of each other. Desired voltage conditions can be easily, rapidly obtained, compared to a case wherein the p-well 16 and n-well 15, or the control gate 2a is set to ground level, and a high positive or negative voltage is applied to the other. Since no charge flows into the p-type silicon substrate 11 in the second embodiment, adverse effects on a peripheral circuit can be minimized.

The above-described embodiments have exemplified a semiconductor memory having both the first and second erase circuits, but the semiconductor memory may comprise only the second erase circuit.

INDUSTRIAL APPLICABILITY

As has been described above, the present invention relates to a semiconductor memory which comprises a pair of impurity-diffused layers formed in the surface area of a semiconductor substrate and a gate electrode formed on a gate insulation film on the semiconductor substrate between the pair of impurity-diffused layers, and traps carriers at different positions in the gate insulation film by applying a predetermined voltage to the gate electrode. The first voltage is applied to the semiconductor substrate including the pair of impurity-diffused layers, and the second voltage is applied to the gate electrode. Accordingly, a tunnel current flows between the semiconductor substrate and the gate electrode to erase carriers trapped in the gate insulation film. Electrons can be reliably erased without leaving them near the center of the channel area. The present invention provides a semiconductor memory which increases the reliability by surely erasing electrons.

What is claimed is:

1. A semiconductor memory comprising:
    a pair of impurity-diffused layers formed in a surface area of a semiconductor substrate, and
    a gate electrode formed on a gate insulation film on the semiconductor substrate between said pair of impurity-diffused layers to thereby trap carriers at different positions in the gate insulation film by applying a predetermined voltage to said gate electrode,
    wherein a tunnel current is supplied between the semiconductor substrate and said gate electrode by applying a first voltage to the semiconductor substrate including said pair of impurity-diffused layers and applying a second voltage to said gate electrode, and
    wherein the tunnel current erases the carriers trapped in the gate insulation film,
    said semiconductor memory further comprising:
        a first well of the same conductivity type as the semiconductor substrate in which said pair of impurity-diffused layers are formed, and
        a second well which covers an area form a side surface to a bottom surface of the first well,
        wherein the first voltage is applied to said first well and said pair of impurity-diffused layers.

2. A semiconductor memory according to claim 1, wherein said gate electrode is shared between a plurality of memory cells, and the carriers in the plurality of memory cells connected to said gate electrode are simultaneously erased by applying the first and second voltages to the plurality of memory cells.

3. A semiconductor memory according to claim 1, wherein a negative voltage generation circuit for applying a negative voltage as the second voltage to said gate electrode is connected to the gate electrode.

4. A semiconductor memory comprising:
    a pair of impurity-diffused layers formed in a surface area of a semiconductor substrate, and
    a gate electrode formed on a gate insulation film on the semiconductor substrate between said pair of impurity-diffused layers to thereby trap carriers at different positions in the gate insulation film by applying a predetermined voltage to said gate electrode,
    wherein a tunnel current is supplied between the semiconductor substrate and said gate electrode by applying a first voltage to the semiconductor substrate including said pair of impurity-diffused layers and applying a second voltage to said gate electrode, and
    wherein the tunnel current erases the carriers trapped in the gate insulation film,
    wherein the carriers which are trapped in the gate insulation film and exist near the pair of impurity-diffused layers are erased by applying a third voltage to one or both of said pair of impurity-diffused layers and applying a fourth voltage to said gate electrode.

5. A semiconductor memory according to claim 4, wherein an erase operation of the carriers by the third and fourth voltages is performed by a first erase circuit, an erase operation of the carriers by the first and second voltages is performed by a second erase circuit, and when the carriers are insufficiently erased by the first erase circuit, the remaining carriers are erased by the second erase circuit.

6. A semiconductor memory according to claim 5, further comprising a counter for counting the number of erase operations by the first erase circuit in order to switch the first erase circuit to the second erase circuit.

7. A semiconductor memory according to claim 6, wherein when the number of erase operations by the first erase circuit that is counted by the counter reaches a predetermined count, the first erase circuit is switched to the second erase circuit.

8. A usage of a semiconductor memory which has a pair of impurity-diffused layers formed in a surface area of a semiconductor substrate, said semiconductor memory also having a gate electrode formed on a gate insulation film on the semiconductor substrate between said pair of impurity-diffused layers to thereby trap carriers at different positions in the gate insulation film by applying a predetermined voltage to said gate electrode, said usage of a semiconductor memory comprising the steps of:

supplying a tunnel current between the semiconductor substrate and said gate electrode by applying a first voltage to the semiconductor substrate including said pair of impurity-diffused layers and applying a second voltage to said gate electrode, and erasing the carriers trapped in the gate insulation film by the tunnel current, wherein the carriers which are trapped in the gate insulation film and exist near said pair of impurity-diffused layers are erased by applying a third voltage to one or both of said pair of impurity-diffused layers and applying a fourth voltage to the gate electrodes.

9. A usage of a semiconductor memory according to claim 8, wherein when the carriers are insufficiently erased by the third and fourth voltages, the remaining carriers are erased by the first and second voltages.

* * * * *